United States Patent
Nakayama et al.

(10) Patent No.: US 6,802,549 B2
(45) Date of Patent: Oct. 12, 2004

(54) NANOTWEEZERS AND NANOMANIPULATOR

(75) Inventors: Yoshikazu Nakayama, 9-404, 14-2, Korigaoka 1-chome, Hirakata-city, Osaka (JP), 573-0084; Seiji Akita, Izumi (JP); Akio Harada, Osaka (JP); Takashi Okawa, Osaka (JP)

(73) Assignees: Yoshikazu Nakayama, Osaka (JP); Daiken Chemical Co., Ltd., Osaka (JP)

( * ) Notice: Subject to any disclaimer, the term of this patent is extended or adjusted under 35 U.S.C. 154(b) by 0 days.

(21) Appl. No.: 10/406,845

(22) Filed: Apr. 4, 2003

(65) Prior Publication Data

US 2003/0189351 A1 Oct. 9, 2003

Related U.S. Application Data

(62) Division of application No. 10/009,471, filed as application No. PCT/JP01/01803 on Mar. 8, 2001, now Pat. No. 6,669,256.

(30) Foreign Application Priority Data

Mar. 8, 2000 (JP) .................................. 2000-112767
Dec. 7, 2000 (JP) .................................. 2000-404006

(51) Int. Cl.[7] .............................. B25J 15/12; B25J 7/00
(52) U.S. Cl. ..................... 294/99.1; 294/86.4; 901/16; 901/36
(58) Field of Search ............................. 294/1.1, 86.4, 294/99.1, 902; 901/30, 31, 36, 39, 16; 29/729, 740

(56) References Cited

U.S. PATENT DOCUMENTS 4,666,198 A 5/1987 Heiserman

FOREIGN PATENT DOCUMENTS

| JP | 3-60988 | * | 3/1991 | .............. 294/86.4 |
|----|---------|---|--------|------------------------|
| JP | 3-154784 | * | 7/1991 | .............. 294/86.4 |
| JP | 405244782 | * | 9/1993 | |
| JP | H6-238578 | | 8/1994 | |
| JP | H7-52072 | | 2/1995 | |
| JP | 407156082 A | | 6/1995 | |
| JP | 408090431 A | | 4/1996 | |
| JP | 408257926 A | | 10/1996 | |
| JP | 409314484 A | | 12/1997 | |
| JP | H2000-516708 | | 12/2000 | |

* cited by examiner

Primary Examiner—Dean J. Kramer
(74) Attorney, Agent, or Firm—Koda & Androlia

(57) ABSTRACT

To provide nanotweezers and a nanomanipulator which allow great miniaturization of the component and are capable of gripping various types of nano-substances such as insulators, semiconductors and conductors and of gripping nano-substances of various shapes.

Electrostatic nanotweezers 2 are characterized in that the nanotweezers 2 are comprised of a plurality of nanotubes whose base end portions are fastened to a holder 6 so that the nanotubes protrude from the holder 6, coating films which insulate and cover the surfaces of the nanotubes, and lead wires 10, 10 which are connected to two of the nanotubes 8, 9; and the tip ends of the two nanotubes are freely opened and closed by means of an electrostatic attractive force generated by applying a voltage across these lead wires. Furthermore, by way of forming a piezo-electric film 32 on the surface of the nanotube 9, and the tip ends of the nanotubes are freely opened and closed by expanding and contracting the piezo-electric film, thus allowing any desired nano-substances to be handled regardless of whether the nano-substances are insulators, semiconductors or conductors. Furthermore, if by way of designing three nanotubes so as to be freely opened and closed by an electrostatic system, nano-substances of various shapes such as spherical, rod-form, etc. can be handled. Moreover, a nanomanipulator that is constructed by combining the nanotweezers with a three-dimensional driving mechanism facilitates the gripping, moving and releasing of nano-substances.

3 Claims, 12 Drawing Sheets

US 6,802,549 B2

NANOTWEEZERS AND NANOMANIPULATOR

This is a Divisional Application of application Ser. No. 10/009,471 filed Nov. 7, 2001, now U.S. Pat. No. 6,669,256.

TECHNICAL FIELD

The present invention relates to nanotweezers that grip and release substances that have a size on the order of nanometers (hereafter referred to as "nano-substances") and further relates to a nanomanipulator device which can assemble nano-size parts and nano-molecular devices, etc. by moving and stacking nano-substances.

BACKGROUND ART

Technological development in recent years has been increasingly oriented toward the ultra-small region. For example, there has been a demand for the development of revolutionary manufacturing techniques in the nano-region, as seen in the creation of new materials and nano-size parts in the optical and electronic information fields, and in the creation of new bio-related functional substances by the integration of cells and proteins.

In order to move and stack nano-substances in this manner, it is necessary to develop nanotweezers that can grip and release nano-substances. A first prototype of such nanotweezers has been announced by Philip Kim and Charles M. Lieber in the Journal of Science published on Dec. 10, 1999. FIGS. 16 through 18 are diagrams of the manufacturing process of these nanotweezers.

FIG. 16 is a side view of the tip end of a glass tube that has been worked so that a taper is formed. The diameter of this tip end is approximately 100 nm, while the diameter of the rear end of the tube not shown is 1 mm. FIG. 17 is a complete diagram of a set of nanotweezers. Two metal electrode films 84a and 84b are formed on the circumferential surface of the above-described glass tube 80 with an insulating section 82 interposed. Carbon nanotubes 86a and 86b are respectively fastened to these metal electrode films so that the carbon nanotubes protruded, thus forming a set of nanotweezers 88.

FIG. 18 is a schematic diagram showing the application of a voltage to the nanotweezers. Lead wires 92a and 92b are led out from contact points 90a and 90b on the metal electrode films 84a and 84b and are connected to both ends of a direct-current power supply 94. When the voltage of this direct-current power supply 94 is applied, the carbon nanotube 86a is charged to a positive polarity, while the carbon nanotube 86b is charged to a negative polarity. As a result of the electrostatic attractive force of these positive and negative charges, the tip ends of the carbon nanotubes 86a and 86b close inward, so that a nano-substance 96 can be gripped between these tip ends.

If the voltage is increased, the carbon nanotubes close even further, so that a smaller nano-substance can be gripped. If the voltage is reduced to zero, the electrostatic attractive force is eliminated, so that the carbon nanotubes 86a and 86b are caused to return to the state shown in FIG. 17 by the elastic recovery force of the carbon nanotubes 86a and 86b, thus releasing the nano-substance 96. Thus, the nanotweezers are advantageous in that the opening-and-closing control of the nanotweezers 88 can be accomplished merely by controlling the magnitude of a voltage as described above, so that the nanotweezers represent a breakthrough in terms of nanotweezers.

However, the nanotweezers 88 have the drawbacks. More specifically, the first drawback is that since the tip end of the glass tube 80 is finely worked to 100 nm in a tapered form, thus the nanotweezers 88 are weak and brittle in terms of strength.

The second drawback is that the metal electrode films 84a and 84b are formed along the entire length of the glass tube 80; and the contact points 90a and 90b are disposed on the large-diameter rear portion of the glass tube and are connected to the power supply 94 via the lead wires 92a and 92b. In other words, the lead wires have a considerable thickness; as a result, the electrical contact points must be disposed on the rear end portion of the glass tube, which has an expanded diameter. This results in the difficulty of forming the metal electrode films along the entire length of the glass tube and in poor efficiency.

The third drawback arises from the fact that the nanotweezers are electrostatic nanotweezers. More specifically, in the case of electrostatic nanotweezers, positive and negative electrical charges are accumulated in the carbon nanotube, and the opening and closing actions of the carbon nanotubes are controlled by the electrostatic attractive force of these electrical charges. In cases where the nano-substance 96 is an electrical insulator or a semiconductor, such an electrostatic attractive force can be utilized. However, in cases where the nano-substance is a conductor, the ends of the carbon nanotubes are electrically short-circuited, so that such an electrostatic attractive force ceases to operate. Furthermore, there is also a danger that the nano-substance will be electrically destroyed in the case of short-circuiting. Accordingly, such nanotweezers suffer from such weak points that the use of the nanotweezers is limited to semiconductor nano-substance and insulating nano-substances, and constant care must be taken during use.

The fourth drawback is that the nanotweezers are constructed from two carbon nanotubes. In other words, molecules have various shapes, and there are nano-substances that cannot be securely gripped by two nanotubes. For example, flattened nano-substances can be gripped by the two carbon nanotubes 86a and 86b. However, in cases where spherical nano-substances or rod-form nano-substances are gripped, the gripping thereon is unstable, and there is a danger that the nano-substance will fall out of the nanotweezers.

Accordingly, a first object of the present invention is to provide nanotweezers that have a high strength and are relatively easy to work.

Furthermore, a second object of the present invention is to provide nanotweezers that can grip conductive nano-substances, semiconductor nano-substances and insulating nano-substances without using an electrostatic system.

Furthermore, a third object of the present invention is to provide nanotweezers which can securely grip and transfer nano-substances of various shapes including spherical nano-substances, rod-form nano-substances, etc.

Furthermore, a nanomanipulator device which can assemble nano-structures is realized way of using the nanotweezers.

DISCLOSURE OF THE INVENTION

The first construction of the present invention is far nanotweezers which are characterized in that the nanotweezers comprise a plurality of nanotubes whose base end portions are fastened to a holder so that the nanotubes protrude from the holder, a coating film which covers the surfaces of the nanotubes with an insulating coating, ad lead wires which are connected to two nanotubes among nanotubes; wherein the tip ends of the two nanotubes are freely opened and closed by means of an electrostatic attractive farce created by applying a voltage across the lead wires.

The second construction of the present invention is for nanotweezers which are characterized in that the nanotweezers comprise a pyramid portion which is installed on a cantilever so that the pyramid portion protrudes from the cantilever, a plurality of nanotubes whose base end portions are fastened to this pyramid portion so as to protrude from the pyramid portion, and lead wires which are connected to two nanotubes among the nanotubes; wherein the tip ends of the two nanotubes can be freely opened and closed by means of an electrostatic attractive force created by applying a voltage across the lead wires.

The third construction of the present invention for nanotweezers which are characterized in that the nanotweezers comprise a plurality of nanotubes whose base end portions are fastened to a holder so that the nanotubes protrude from the holder, and a piezo-electric film which is formed on the surface of at least one nanotube among these nanotubes; wherein the tip ends of the nanotubes are freely opened and closed by applying a voltage to the piezo-electric film so that the piezo-electric film is caused to expand and contract.

The fourth construction of the present invention is for the nanotweezers in the third construction, wherein the holder is the pyramid portion of a cantilever.

The fifth construction of the present invention is for nanotweezers which are characterized in that the nanotweezers comprise a plurality of deformable pyramid pieces which form pyramid portion oh cantilever, nanotubes which are fastened to the tip ends of the pyramid pieces, and a piezo-electric film which is formed on the side surface of at least one pyramid piece; wherein the tip ends of the nanotubes ere opened and closed by applying a voltage to the piezo-electric film so that the piezo-electric film is caused to expand and contract with the pyramid pieces being freely flexible.

The sixth construction of the present invention is for electrostatic nanotweezers which are characterized in that the electrostatic nanotweezers comprise three or more conductive nanotubes whose base end portions are fastened to a holder so as to protrude from the holder, and lead electrodes which are respectively connected to three or more conductive nanotubes among the nanotubes wherein the conductive nanotubes are freely opened and closed by means of an electrostatic attractive force created by applying a voltage across the lead electrodes.

The seventh construction of the present invention is for electrostatic nanotweezers which are characterized in that the nanotweezers comprise a protruding portion which is disposed on a cantilever so that the protruding portion protrudes from the cantilever, three or more conductive nanotubes whose base end portions are fastened to the protruding portion so as to protrude from the protruding portion, and lead electrodes which are respectively connected to each one of three or more of the nanotubes among the conductive nanotubes; wherein the tip ends of the conductive nanotubes are freely opened and closed by an electrostatic attractive force created by applying a voltage across the lead electrodes.

The eighth construction of the present invention is for a nanomanipulator which is characterized in that the nanomanipulator is comprised of the nanotweezers of constructions 1,2,3,4, 5, 6 or 7, and a three-dimensional driving mechanism which moves and controls the nanotweezers in X, Y and Z directions with respect to a sample and nano-substances are transferred to the sample by the nanotweezers.

The ninth construction of the present invention is the nanomanipulator device of the eight construction, wherein at least one of the nanotubes that form the nanotweezers is wed as a probe needle of a scanning probe microscope.

The term "pyramid portion" is used in the same meaning as the term "protruding portion" of the cantilever.

As a result of diligent research conducted for the purpose of developing nanotweezers possessing durability, the inventors of the present application succeeded in improving electrostatic attraction type nanotweezers utilizing the above-described nanotubes and further succeeded in developing high-performance piezo-electric film type nanotweezers.

First, a weak point of conventional electrostatic attraction type nanotweezers is that the nanotubes are electrically short-circuited in cases where the nano-substance that is being gripped is a conductive substance, so that the tweezers function is lost and there is a danger of breakage. In order to alleviate this drawback, nanotweezers are hereby proposed in which a coating film consisting of an insulating substance is formed on the surfaces of the nanotubes, so that short-circuiting at the time of contact is prevented. If this coating film is formed so that it is not limited to the nanotubes but extends to other wiring areas, then the insulating properties of the nanotweezers as a whole is enhanced. This insulating treatment is applicable to electrostatic type nanotweezers of any structure.

A second weak point of conventional devices is that the nanotweezers are weak and brittle in terms of strength, and this is because the nanotubes are fastened to a pointed glass tube. In order to alleviate this drawback, it is hereby proposed that the pyramid portion of an AFM (atomic force microscope) cantilever be used as a holder for the nanotubes. This pyramid portion is made of silicon or silicon nitride; as a result, the pyramid portion has electrical insulating properties and a much higher strength than conventional glass tubes.

The above-described two inventions will be comprehensively described here using a cantilever. The base end portions of two nanotubes are fastened to points near the apex of the pyramid portion, so that the tip end portions of these nanotubes are caused to protrude from the pyramid portion. Two types of nanotube fastening methods may be used. In the first method, areas near the base end portions of the nanotubes are irradiated with an electron beam inside an electron microscope. As a result of this irradiation, a carbon film or CVD film is formed as a coating film so that the base end portions of the nanotubes are covered. This coating film restrains the base end portions, and the nanotubes are firmly fastened. In the second method, the base end portions of the nanotubes are fused to the surface of the pyramid portion when these base end portions are directly irradiated with an electron beam. These fused portions fasten the nanotubes in place.

Next, lead wires are connected to the base end portions of the nanotubes. In the present invention, nanotubes or metal wiring formed by CVD (chemical vapor-phase deposition), etc. can be used as lead wires. For example, nanotubes are elements that have a high strength and an extremely high flexibility, and various diameters and lengths are available. Accordingly, such nanotubes are optimal as nano-size lead wires. Furthermore, metal atoms can be formed into very small wiring patterns by CVD.

One end of each nanotube lead wire is caused to contact the above-described base end portion of the corresponding nanotube, and this contact point is irradiated with an electron beam so that the nanotube lead wire is integrally fastened to the pyramid portion by spot welding. The other end of the nanotube lead wire may be connected to another nanotube lead wire or may be connected to an electrode film formed on the cantilever. Furthermore, CVD lead wires may be formed while being fastened to the base end portions of the nanotubes or to the surface of the pyramid portion.

After these lead wires are formed, a coating film consisting of an insulating material is formed on the base end portions of the nanotubes and over the entire area of each lead wire. Short-circuiting in an electrostatic system can be prevented by forming a coating film on the surfaces of the nanotubes. At the same time, the nanotweezers as a whole can be protected from short-circuiting, etc. by forming a coating film over the entire surface of the wiring. In such a case, there is no current leakage even if the nanotweezers are operated in electrolyte solutions such as biological fluids, etc. Electron beam irradiation or CVD may be utilized to form such a coating film.

Since the cantilever is relatively large, the connection of the electrode films on the cantilever with an external power supply circuit can be performed under an optical microscope or an optical magnifying glass. Such an external power supply circuit is constructed from a power supply, a voltage control circuit and an electrical switch. If the applied voltage is freely adjusted by means of the voltage control circuit, the degree of opening between the tip ends of the nanotubes can be arbitrarily adjusted, so that the opening and closing of the nanotweezers can be controlled in accordance with the size of the nano-substance that is being handled.

Furthermore, piezo-electric film type nanotweezers which are completely different from the electrostatic attraction type are also presented herein. In this piezo-electric film system, the nanotubes can be freely flexed by the expansion and contraction of a piezo-electric film, so that the tip ends of the nanotubes can be opened and closed. Accordingly, since no current flows between the nanotubes, the nanotweezers can be caused to function regardless of the electrical properties of the nano-substance.

In this piezo-electric film system, the holder of the nanotubes is not limited to an AFM or STM (tunnel microscope) holder. Probe needles used in a broad range of SPM (scanning probe microscopes) may be used. SPM probe needles are considerably larger than nanotubes in terms of size and have a sufficient size for the fastening of two nanotubes. The most effective holder is the pyramid portion of the AFM cantilever. This cantilever will be used in the following description.

First, the base end portions of two nanotubes are fastened to the pyramid portion of such a cantilever. In this case, the two nanotubes are placed so that the tip end portions of the nanotubes contact each other. In other words, the nanotubes are fastened so that the tip ends of the nanotubes are in contact. Fastening methods that can be used include the above-described coating film method and fusion method. Either of these fastening methods may be used.

Next, a piezo-electric film is formed on one of the two nanotubes. This piezo-electric film is also called a piezo-electric element and has the property of contracting when a voltage is applied. If the voltage is made variable, the amount of contraction also varies. When the piezo-electric film contracts, the nanotube to which this film is fastened flexes so that the nanotweezers open. Accordingly, the tip ends of the nanotubes are initially closed; and when a voltage is applied, the tip ends are opened, and the nano-substance is gripped in this open state. When the voltage is further increased, the degree of opening is increased, and the nano-substance is released. In cases where the nano-substance fails to separate from the nanotubes because of inter-molecular forces, the nano-substance can be electrically expelled by applying a voltage between the sample and the nanotubes.

One end of a nanotube lead wire may be connected to each end of the piezo-electric film, and the other ends of these nanotube lead wires may be connected to other nanotube lead wires. As described above, the lead wires may also be connected to electrode films on the cantilever. Indeed, CVD lead wires may also be utilized. Then, connections are made from these electrode films to an external power supply circuit. This external power supply circuit is comprised of a power supply, a voltage control circuit and an electrical switch. The operation of this circuit is done as described above.

Piezo-electric films may be formed on two nanotubes. In this case, two nanotubes can be flexed by the application of a voltage, so that the degree of opening of the tip ends of the nanotubes can be set at a larger value, thus making it possible to increase the performance of the nanotweezers.

A piezo-electric film is formed on the surface of the pyramid portion instead of being formed on the surfaces of the nanotubes. In this case, the pyramid portion is etched by means of a convergent ion beam device so that the pyramid portion is split into two pyramid pieces via the etched portion. The thickness of the respective pyramid pieces is adjusted so that the pyramid pieces possess flexibility. One nanotube is disposed on each pyramid piece so that the nanotube protrudes from the pyramid piece. Thus, a total of two nanotubes are provided so as to protrude in a manner that the tip ends of the nanotubes contact each other. A piezo-electric film is formed on the side surface of one or both pyramid pieces, and this piezo-electric film is caused to contract by applying a voltage to both ends of the piezo-electric film in the same manner as described above. As a result of this contraction, the pyramid piece(s) flex, and the tip ends of the nanotubes open. Afterward, the nanotubes function as nanotweezers by gripping or releasing nano-substances.

In the third invention, it is possible to use a construction, in either the electrostatic attraction system or piezo-electric film system, in which the nanotubes used in the nanotweezers consist of more than two nanotubes. For example, if three nanotubes are used, then nano-substances are gripped by these three nanotubes.

In a three-nanotube system, the three nanotubes are opened and closed. Instead, the opening and closing action of two of the three nanotubes may be controlled by an electrostatic attraction system. Furthermore, it is also possible to form piezo-electric films on two nanotubes so as to control the opening and closing action of the two nanotubes. In cases where the opening and closing of two of the three nanotubes is controlled, the remaining single nanotube functions as an auxiliary nanotube. In the three-nanotube system, since the nano-substance is gripped by three nanotubes, the gripping of nano-substances of various shapes such as spherical, rod-form, etc. can be accomplished more securely. In particular, if two nanotubes are set at the same polarity and one nanotube is set at a different polarity in the three-nanotube electrostatic system, the three nanotubes attract each other by an electrostatic attractive force. The gripping of nano-substances of unusual shapes becomes thus more secure.

In the piezo-electric film system as well, voltage application is accomplished by means of lead wires. Accordingly, by way of coating the surfaces of the piezo-electric films and the lead wires with an insulating substance, the danger of short-circuiting is eliminated. Consequently, the nanotweezers can also be operated in electrolyte solutions.

Not only conductive carbon nanotubes but also nanotubes in general such as insulating BCN nanotubes and BN nanotubes, etc. can be utilized as the nanotubes of the present invention. Carbon nanotubes are abbreviated as "CNT" and are manufactured utilizing the arc discharge of a carbon rod. In BCN nanotubes, some of the C atoms of CNT are replaced by B atoms and N atoms, and BN nanotubes are nanotubes in which almost all of the C atoms of CNT are replaced by B atoms and N atoms. Various methods have been developed as replacement methods. Conductive nanotubes include carbon nanotubes and insulating nanotubes which have a conductive film formed on the circumference of the nanotube.

BEST MODE FOR CARRYING OUT THE INVENTION

Embodiments of the nanotweezers of the present invention and nanomanipulator devices that use the nanotweezers will be described in detail below with reference to the accompanying drawings.

First Embodiment
[Two-Nanotube Electrostatic Nanotweezers]

Figure 1:
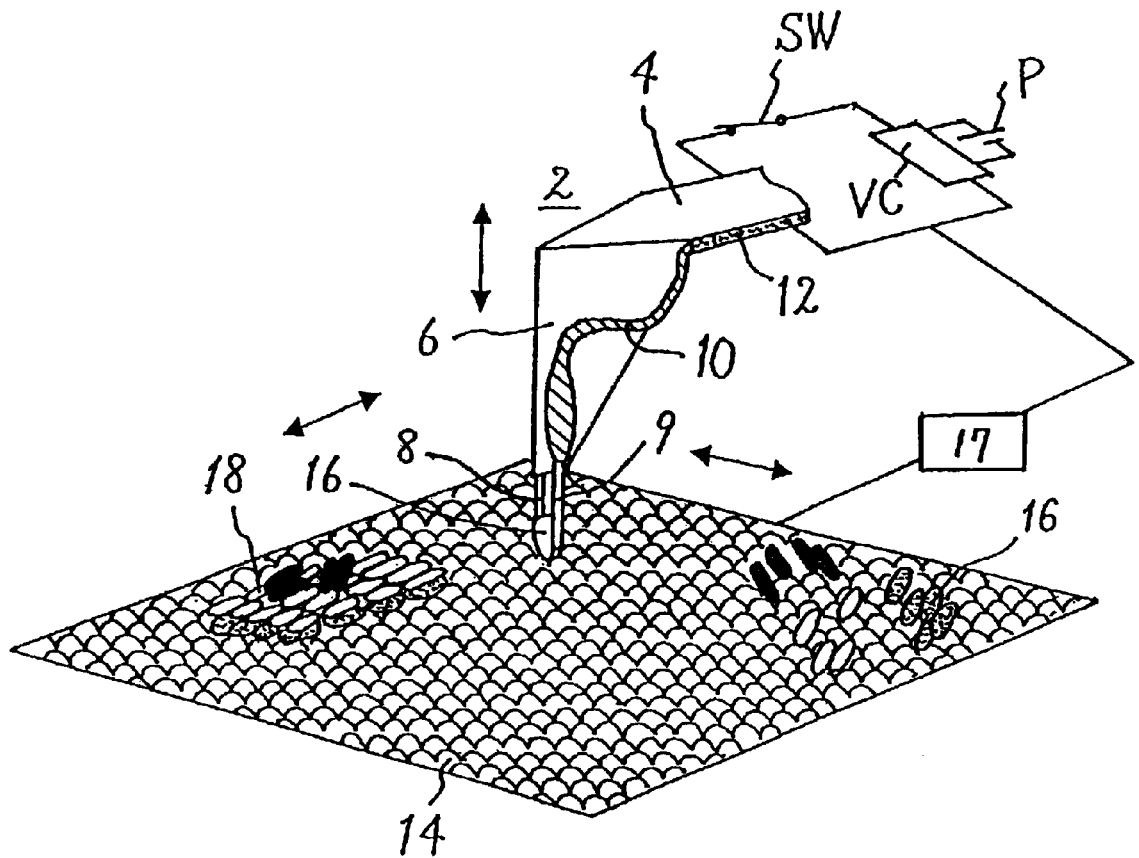
FIG. 1 is an explanatory diagram of the operation of a nanomanipulator device that uses the nanotweezers of the present invention.

FIG. 1 is an explanatory diagram of the operation of a nanomanipulator device using the nanotweezers of the present invention. The nanotweezers 2 are comprised of two nanotubes 8 and 9 that protrude from a pyramid portion 6. The pyramid portion 6 protrudes from the tip end of an AFM cantilever 4. Lead wires 10, 10 are disposed on the base end portions of these nanotubes 8 and 9 and are connected to electrode films 12, 12 formed on the left and right side surfaces of the cantilever 4. The electrode films 12, 12 are connected to an electrical switch SW, power supply P and voltage control circuit VC, so that an appropriate voltage is applied to the nanotubes 8 and 9.

The two nanotubes 8 and 9 are disposed so as to be in close proximity to a sample 14. Numerous nano-substances 16 of various types are disposed on the surface of the sample 14. The nanotube 8 protrudes further downward than the nanotube 9. Accordingly, the nanotube 8 can also be utilized as an AFM probe needle. First, this nanotube 8 is scanned as an AFM probe needle by a three-dimensional driving mechanism 17, thus confirming the position and shape of the nano-substance 16 that is to be gripped.

The opening and closing action of the nanotubes 8 and 9 are controlled by way of applying a voltage. The degree of opening is varied depending upon to the magnitude of the voltage. Accordingly, the nanotubes 8 and 9 are opened and grip the nano-substance 16 which has been marked by the AFM; and in this state, the nanotweezers are moved by a three-dimensional driving mechanism 17 to the nano-circuit 18 along the direction indicated by the arrow, and the nanotubes 8 and 9 are further opened, thus releasing the nano-substance 16. In cases where the nano-substance fails to separate from the nanotubes because of Van der Waals force, a voltage is applied between the nanotweezers and the nano-circuit. As a result, the nano-substance is released by an electrostatic attractive force. The nano-circuit 18 is assembled into a desired structure as a result of the release of the nano-substance 16 in an appropriate location of the nano-circuit 18.

Figure 2:
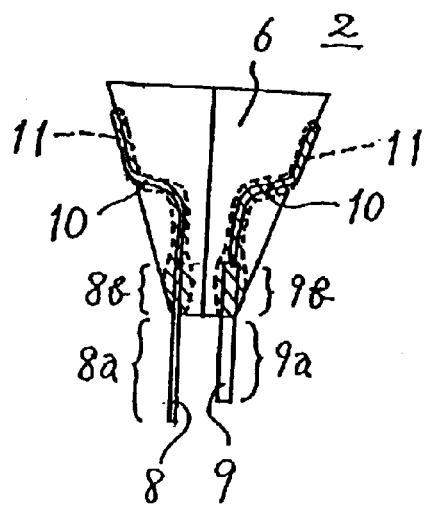
FIG. 2 is a schematic front view of a first embodiment of the nanotweezers of the present invention.
Figure 3:
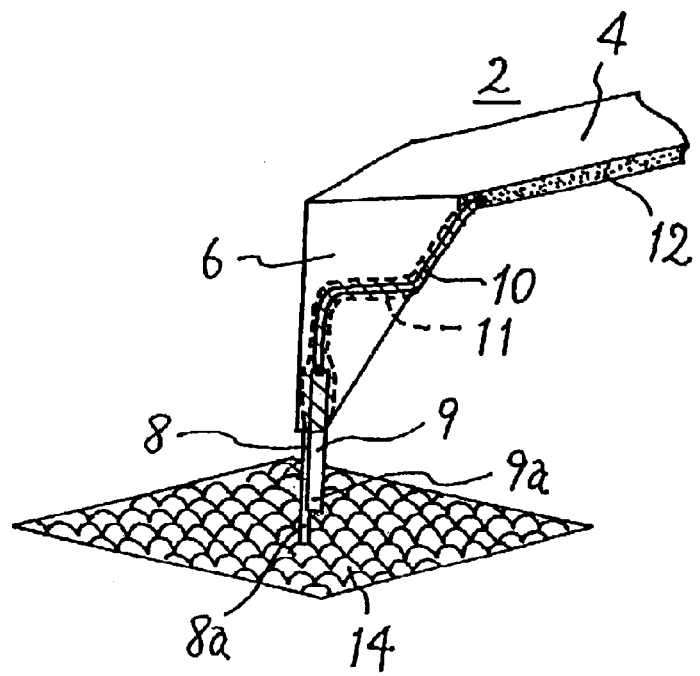
FIG. 3 is a schematic perspective view showing the nanotweezers of the first embodiment disposed facing a sample.
Figure 4:
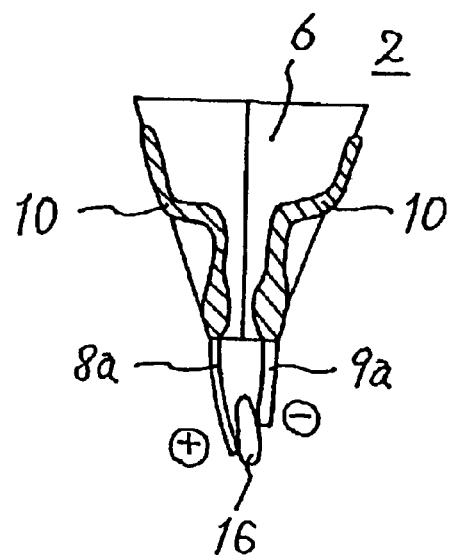
FIG. 4 is a schematic front view of the nanotweezers of the first embodiment gripping a nano-substance.

FIGS. 2 through 4 illustrate a first embodiment of the nanotweezers of the present invention. FIG. 2 is a schematic front view of the nanotweezers 2. A long, slender nanotube 8 and a short, thick nanotube 9 are disposed on the tip end of the pyramid portion 6 by fastening the base end portions 8b and 9b of these nanotubes 8 and 9 to the pyramid portion 6. The tip end portion 8a of the nanotube 8 is caused to protrude further downward than the tip end portion 9a of the nanotube 9, so that the tip end portion 8a can be utilized as an AFM probe needle.

The base end portions 8b and 9b are covered and fastened in place by coating films 11, 11 as a result of the peripheries of the tip end portions being irradiated by an electron beam. Furthermore, on the upper ends of the base end portions 8b end 9b, the nanotubes are connected to lead wires 10, 10. The other ends of the lead wires 10, 10 are connected to the electrodes 12, 12 shown in FIG. 1. Lastly, the coating films 11,11 are formed on the surfaces of the nanotube lead wires 10,10, thus fastening the lead wires to the pyramid portion 6. The coating films 11 are indicated by hatching.

FIG. 3 is a schematic perspective view showing the nanotweezers 2 disposed so as to face the sample 14. The recesses and projections in the surface of the sample 14 indicate surface atoms. Since the tip end portion 8a of the nanotube 8 protrudes further downward than the tip end portion 9a of the nanotube 9, the recessed and projecting structure of the surface atoms is detected by way of using the tip end portion 8a as an AFM probe needle. For example, the positions and shapes of nano-substances placed on the sample 14 are detected.

FIG. 4 is a schematic front view of the nanotweezers 2 that grip a nano-substance 16. A direct-current voltage is applied to the nanotubes 8 and 9 from the lead wires 10, 10. Positive and negative charges are accumulated in the tip end portions 8a and 9a, and the electrostatic attractive force of these positive and negative charges causes the tip end portions 8a and 9a to close with a degree of opening corresponding to the applied voltage, so that the nano-substance 16 is gripped between the tip end portions. The gripped nano-substance 16 is nano-substance detected by AFM in FIG. 3.

Figure 5:
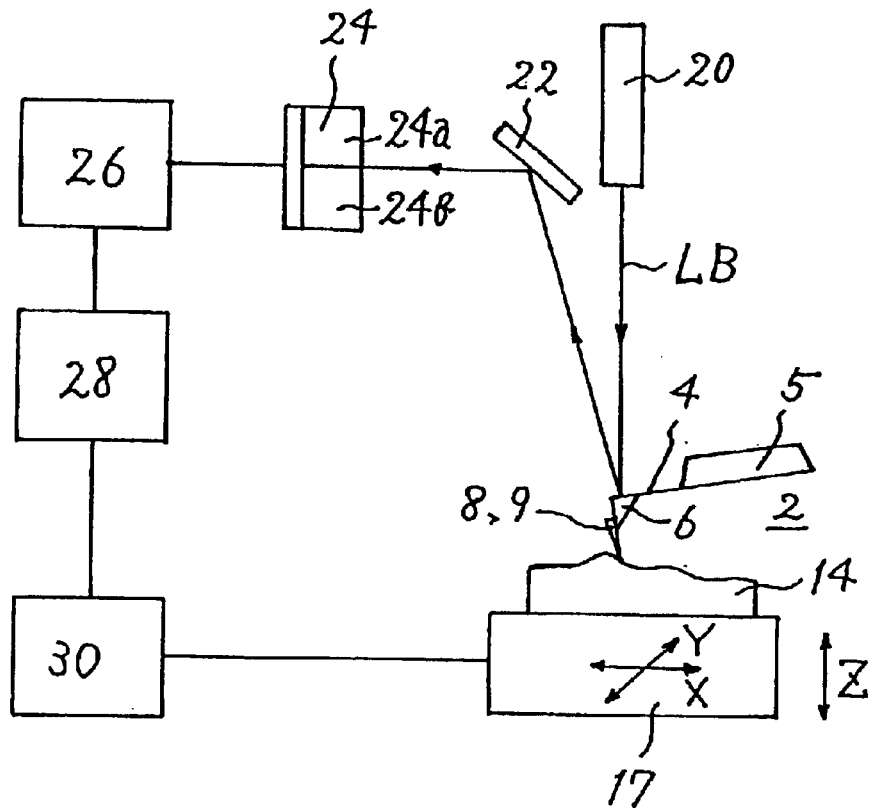
FIG. 5 is a schematic structural diagram of the nanomanipulator device of the present invention.

FIG. 5 is a schematic structural diagram of the nanomanipulator device of the present invention. As described above, the nanotweezers 2 are constructed from a cantilever 4, a substrate 5, a pyramid 6 and nanotubes 8 and 9. The sample 14 is driven three dimensionally by a three-dimensional driving mechanism 17 that consists of piezo-electric elements. More specifically, the sample is driven so that the nanotubes 8 and 9 are moved in the X, Y and Z directions with reference to the surface of the sample 14. Indeed, it is also possible to drive the nanotweezers 2 directly in three dimensions with the sample being stationary. It is thus important that the nanotweezers 2 and sample 14 are driven relative to each other in three dimensions.

The reference numeral 20 indicates a semiconductor laser device, 22 indicates a reflective mirror, 24 indicates a two-part light detector, 26 indicates a Z axis detection circuit, 28 indicates a display device, and 30 indicates an XYZ scanning circuit.

The nanotubes 8 and 9 are caused to approach the sample 14 in the direction of the Z axis until the nanotubes 8 and 9 reach a specified repulsive force position, and then the necessary nano-substance 16 is gripped. Afterward, the three-dimensional driving mechanism 17 is scanned by the XYZ scanning circuit 30, thus moving the nanotubes 8 and 9 to a specified position. In the process of this motion, because of the need to maintain the separation distance between the nanotubes 8 and 9 and the sample surface at a fixed value, it is required to control the positions of the nanotubes in the direction of the Z axis so that the repulsive force received by the nanotubes always remains constant. For this purpose, a laser beam LB is reflected by the cantilever 4, this laser beam LB is introduced into the two-part light detector 24 via the reflective mirror 22, and then a Z axis control is performed while detecting the deflection to the upper and lower detectors 24a and 24b.

The Z position is detected by the Z axis detection circuit 26, and the X and Y positions are detected by the XYZ scanning circuit 30. This positional information is displayed on the display device 28. In other words, an image of the recesses and projections of the sample surface is displayed on the display device 28. Then, after the nanotubes 8 and 9 have moved to the specified position, the nanotubes 8 and 9 are opened so as to release the gripped nano-substance 16 onto the sample surface. By repeating this operation, numerous nano-substances are assembled in specified locations, thus constructing, for instance, the nano-circuit 18. By operating the nanotube 8 as an AFM, it is also possible to image the overall shape of the nano-circuit 18 on the display device 28. Accordingly, the nanomanipulator device of the present invention is a nano-robot that allows the free construction of a nano-world. This nanomanipulator device can be used in various types of atmospheres including vacuums and the natural atmosphere, and can be operated in the manner of a robot arm inside devices such as electron microscopes, etc.

Second Embodiment

[Two-Nanotube Piezo-Electric Film Nanotweezers]

Figure 6:
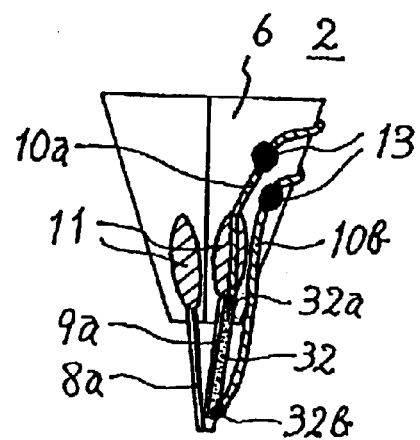
FIG. 6 is a schematic front view of a second embodiment of the nanotweezers of the present invention.
Figure 7:
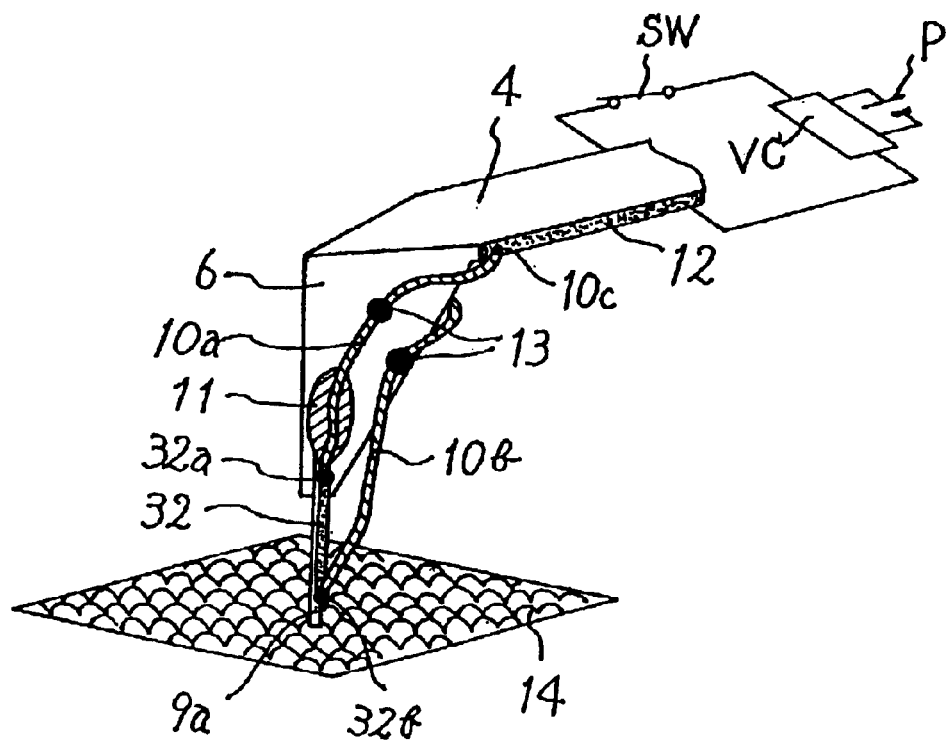
FIG. 7 is a schematic perspective view showing the nanotweezers of the second embodiment disposed facing a sample.
Figure 8:
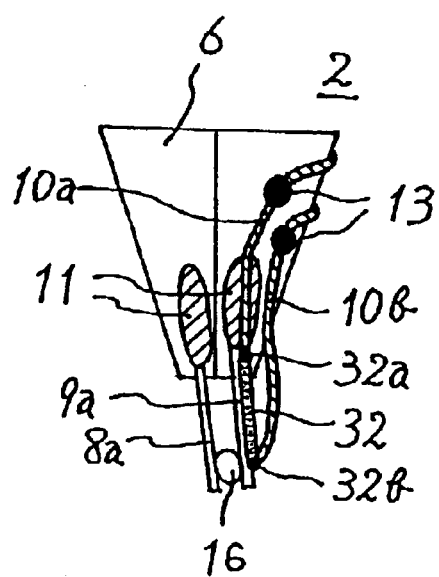
FIG. 8 is a schematic front view of the nanotweezers of the second embodiment gripping a nano-substance.

FIGS. 6 through 8 illustrate a second embodiment of the nanotweezers of the present invention. FIG. 6 is a schematic front view of the nanotweezers 2. The base end portions 8b and 9b of nanotubes 8 and 9 are fastened to a pyramid portion 6 by means of coating films 11, 11 so that the tip end portions 8a and 9a of the nanotubes 8 and 9 contact each other at their tip ends. A piezo-electric film 32 is formed on the surface of the tip end portion 9a of the nanotube 9, and nanotube lead wires 10a and 10b are connected to the upper end 32a and lower end 32b of this piezo-electric film 32. Respective intermediate points of the nanotube lead wires 10a and 10b are fastened to the pyramid portion 6 by spot-form coating films 13, 13.

FIG. 7 is a schematic perspective view showing the nanotweezers 2 disposed so as to face a sample 14. The other ends 10c and 10d of the nanotube lead wires 10a and 10b are fastened to electrodes 12, 12 on the cantilever 4. An electrical switch SW, power supply P and voltage control circuit VC are connected to the electrodes 12, 12. The piezo-electric film 32 is caused to contract by the application of a voltage to both ends of this film, and the amount of contraction increases with the applied voltage.

First, with the tip ends of the nanotubes closed, the surface of the sample 14 is subjected to an AFM operation, thus detecting the position and shape of the nano-substance that is to be gripped.

FIG. 8 is a schematic front view of the nanotweezers 2 that has gripped the nano-substance 16. When the electrical switch SW is switched on so that a voltage is applied to the piezo-electric film 32, the nanotube 9 flexes in accordance with the contraction of the piezo-electric film 32, and the nanotubes 8 and 9 are opened, thus gripping the object nano-substance 16. The manner of assembly of the nano-circuit 18 is the same as in FIG. 1, and a description thereof is omitted.

When the piezo-electric film of the nanotweezers is covered with insulation, there is no short-circuiting even if a voltage is applied. If the lead wires are also covered with insulation, the nanotweezers can be operated even in electrolyte solutions.

Third Embodiment

[Two-Nanotube Pyramid Piece Piezo-Electric Film Nanotweezers]

Figure 9:
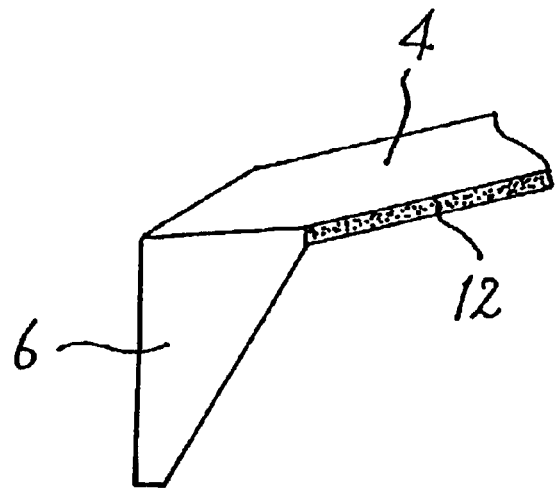
FIG. 9 is a perspective view of the essential parts of a cantilever that has a pyramid portion.
Figure 10:
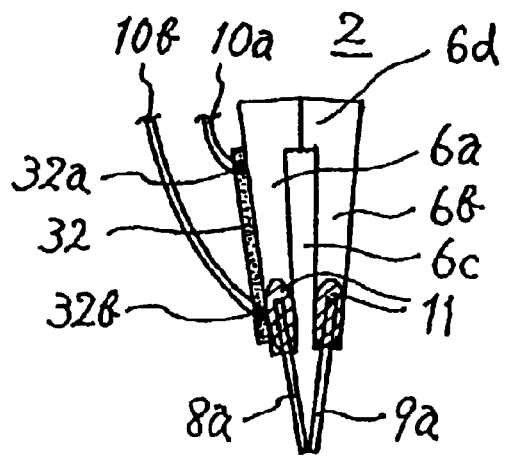
FIG. 10 is a schematic front view of a third embodiment of the nanotweezers of the present invention.
Figure 11:
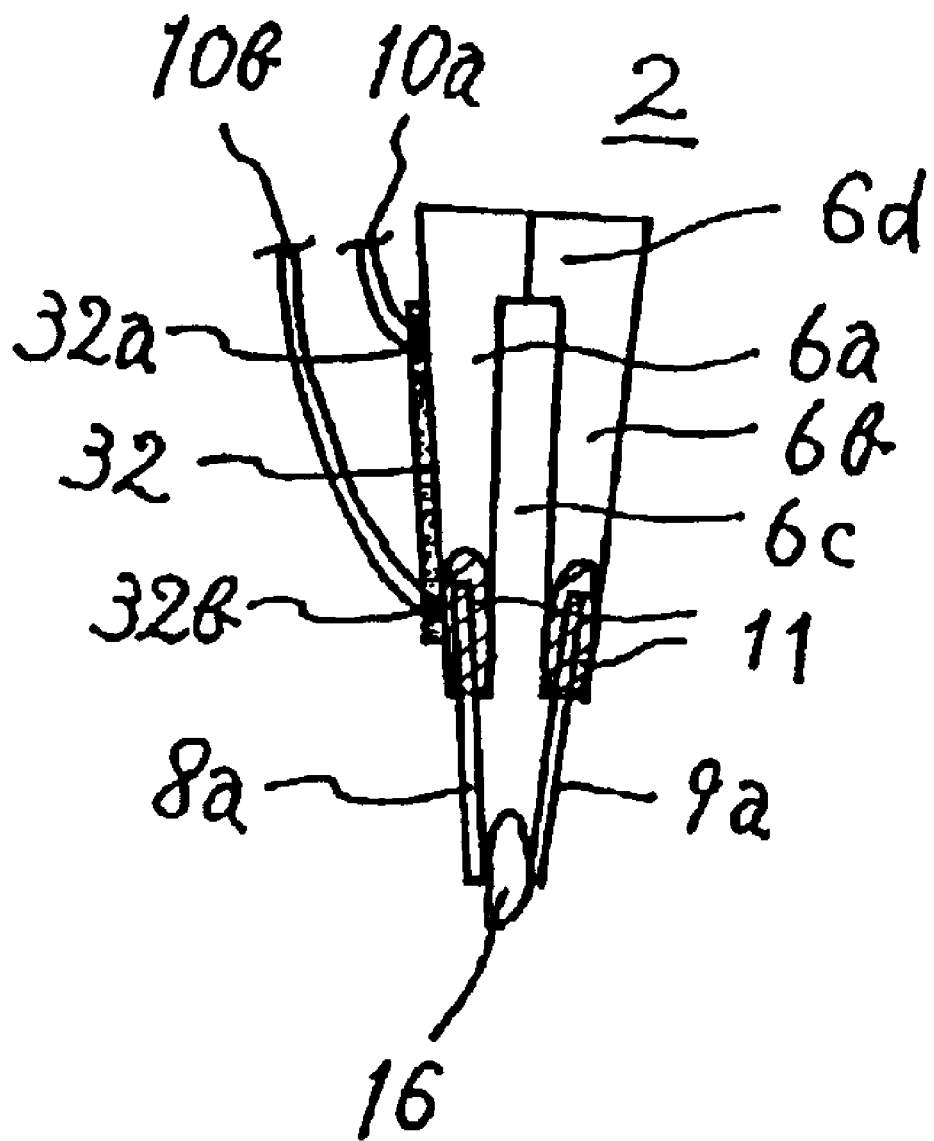
FIG. 11 is a schematic front view of the nanotweezers of the third embodiment gripping a nano-substance.

FIGS. 9 through 11 illustrate the third embodiment of the nanotweezers of the present invention. FIG. 9 is a perspective view of the essential portion of a cantilever 4 which has a pyramid portion 6. This cantilever 4 is an element that is commonly used for AFM measurement. The pyramid portion 6 is formed as a single mass. The pyramid portion 6 is split into two equal pyramid pieces 6a and 6b by etching using a convergent ion beam device. The pyramid pieces 6a and 6b are formed so that they are freely flexible.

FIG. 10 is a schematic front view of these nanotweezers 2. The pyramid pieces 6a and 6b face each other across a gap 6c so that the pyramid pieces 6a and 6b are freely flexible from the base portion 6d. The base end portions 8b and 9b of the nanotubes 8 and 9 are respectively fastened to the pyramid pieces 6a and 6b by coating films 11, 11 so that the tip end portions 8a and 9a of the nanotubes 8 and 9 contact each other at their tip ends. A piezo-electric film 32 is formed on the side surface of the pyramid piece 6a, and nanotube lead wires 10a and 10b are connected to the upper end 32a and lower end 32b of this piezo-electric film 32. These nanotube lead wires 10a and 10b are connected to a power supply circuit similar to that of the second embodiment via the electrodes 12, 12 of the cantilever 4.

First, with the tip ends of the nanotubes in a closed state, the surface of the sample 14 is subjected to an AFM operation, thus detecting the position and shape of the nano-substance that is to be gripped.

FIG. 11 is a schematic front view of the nanotweezers 2 that has gripped a nano-substance 16. When the electrical switch SW is switched on so that a voltage is applied to the piezo-electric film 32, the pyramid piece 6a flexes in accordance with the contraction of the piezo-electric film 32, and the tip end portions 8a and 9a of the nanotubes are opened, thus gripping the detected nano-substance 16. The manner of assembly of the nano-circuit 18 using this nanomanipulator device is the same as in FIG. 1. Accordingly, a description thereof is omitted.

In the above embodiments, two nanotubes and two pyramid pieces are employed. However, a structure that uses a greater number of nanotubes and pyramid pieces is also possible. Furthermore, it is also possible to form a piezo-electric film on two facing nanotubes and pyramid pieces instead of only on a single nanotube and pyramid piece.

Fourth Embodiment
[Three-Nanotube Electrostatic Nanotweezers]

Figure 12:
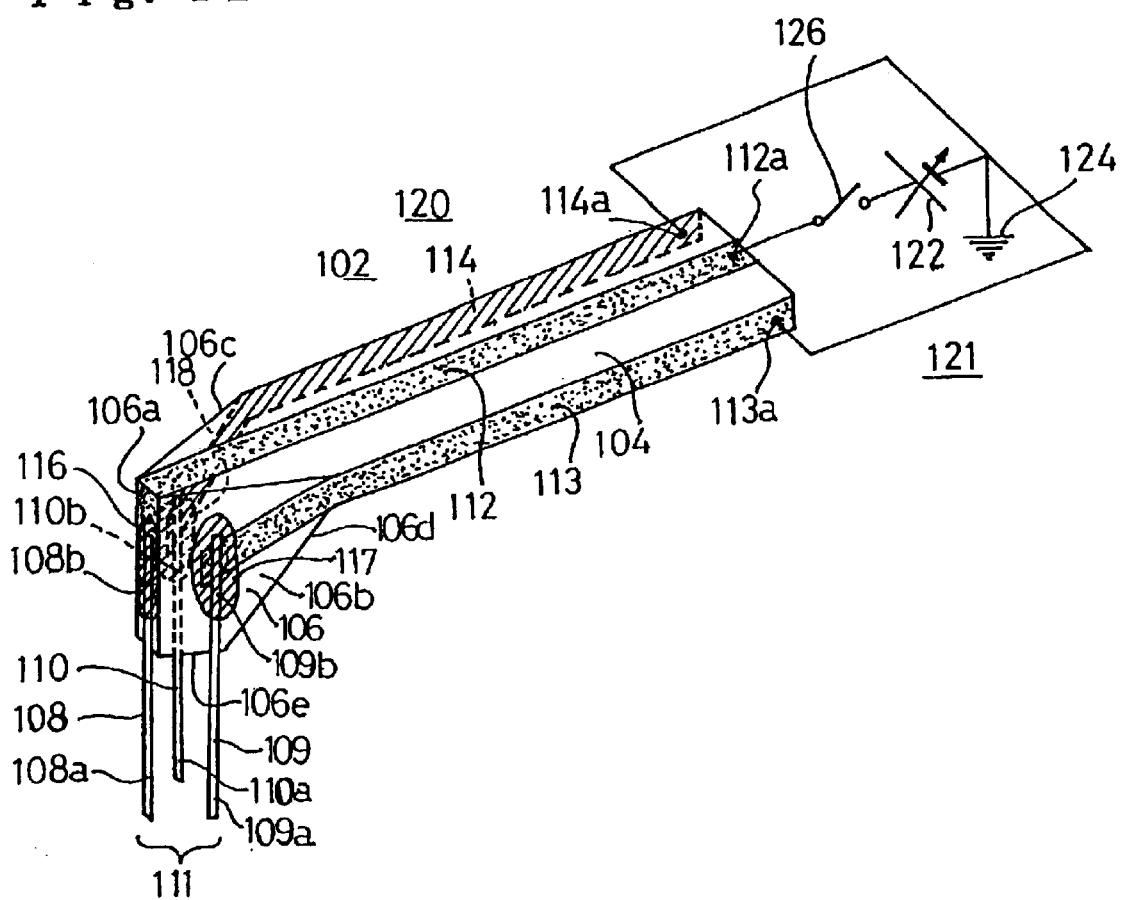
FIG. 12 is a schematic perspective view of a fourth embodiment of the nanotweezers of the present invention (electrostatic nanotweezers).

FIG. 12 is a schematic perspective view of the fourth embodiment of the nanotweezers of the present invention (electrostatic nanotweezers). The cantilever 102 is comprised of a cantilever portion 104 and a protruding portion 106 that is formed on the tip end of the cantilever portion 104. The protruding end 106e of the protruding portion 106 is formed in a substantially horizontal attitude, and the peripheral surfaces of this protruding portion 106 has four surfaces: a tip end surface 106a, side surfaces 106b and 106c, and a rear end surface 106d.

Three electrode films 112, 113 and 114 with specified widths are formed on the upper flat surface and side surfaces of the cantilever portion 104, and the rear ends of these electrode films are formed so that they extend to the tip end surface 106a and side surfaces 106b and 106c of the protruding portion 106. The base end portions 108b, 109b and 10b of conductive nanotubes 108, 109 and 110 are respectively fastened to the tip end surface 106a and side surfaces 106b and 106c by way of being covered by coating films 116, 117 and 118.

Due to this fastening structure, the conductive nanotubes 108, 109 and 110 are respectively set in a state of electrical continuity with the electrode films 112, 113 and 114. The tip end portions 108a, 109a and 110a of the conductive nanotubes 108, 109 and 110 protrude further downward than the protruding end 106e of the protruding portion 106, and these tip end portions 108a, 109a and 110a form a nanotube gripping portion 111, thus forming working claws that can grip and release the nano-substance that constitutes the material that is being handled. Thus, the electrostatic nanotweezers 120 of the present invention are constructed with a nanotube gripping portion 111 formed on a cantilever 102.

The electrostatic nanotweezers of this embodiment are characterized in that the nanotube gripping portion 111 is comprised of three or more nanotubes. In this embodiment, three nanotubes are used, and the nano-substance is gripped in an enveloping manner by these three claws. In other words, though with two nanotubes gripping is unstable, with the use of three nanotubes, it is possible to grip nano-substances of arbitrary shapes in a stable and secure manner. In particular, spherical nano-substances and rod-form nano-substances can be gripped securely.

A control circuit 121 is connected to the rear end portions of the electrode films 112, 113 and 114 of the electrostatic nanotweezers 120 via contact points 112a, 113a and 114a. This control circuit 121 is comprised of a variable direct-current power supply 122, a ground 124 and a switch 126. The contact points 113a and 114a are connected to the ground side, and the contact point 112a is connected to the high-potential side. Accordingly, the electrode film 112 is a positive pole, and the electrode films 113 and 114 function as negative poles.

As described above, nanotubes include conductive carbon nanotubes and insulating BN (boron nitride) nanotubes and BCN (boron carbonitride) nanotubes, etc. It is sufficient if the conductive nanotubes used in this embodiment have electrical conductivity. Accordingly, conductive nanotubes or insulating nanotubes whose surfaces are covered by a conductive material can be used. Metals are suitable as conductive materials used for such covering.

To describe such nanotubes using carbon nanotubes as an example of conductive nanotubes, the diameter of the nanotubes ranges from approximately 1 nm to several tens of nanometers, and the lengths of such nanotubes can be from the nano-order to the micron-order. The aspect ratio (length/diameter) may reach 1000 or greater. Furthermore, since carbon nanotubes have a high degree of flexibility and toughness, such nanotubes are ideal as materials for gripping and releasing nano-substances by opening and closing the tip ends of the nanotubes.

The cantilever 102 used in the above embodiment is one converted from a cantilever probe needle used in an atomic force microscope (AFM). The material of this cantilever probe needle is silicon or silicon nitride, and the probe needle is worked and formed using a semiconductor planer technique. Accordingly, this cantilever has a higher strength than a conventional glass product and is superior in terms of durability. However, in the above embodiment, the protruding end 106e of the protruding portion 106 is not worked to a sharpened point. Rather, it is formed as a flat surface. In other words, this reason is that the protruding portion 106 is not used as a probe needle but is instead used as a fastening holder for conductive nanotubes.

The coating films 116, 117 and 118 are formed by decomposing an organic gas by means of an electron beam inside an electron microscope and using the deposit formed by this decomposition as a coating film. In cases where the organic gas is a hydrocarbon gas, the coating films are carbon films; while in cases where the organic gas is a metallo-organic gas, the coating films are metal films. Metal films provide more secure electrical continuity between the conductive nanotubes 108, 109 and 110 and the electrode films 112, 113 and 114.

As another method for fastening the base end portions of the nanotubes to the protruding portion, it is also possible to fuse the base end portions of the nanotubes by electron beam irradiation or electrical heating so as to have these base end portions integrally fastened to the protruding portion. If coating films and fusion are used in combination, the nanotubes can be fastened more firmly, thus preventing the nanotubes from falling off. The durability of the electrostatic nanotweezers thus improves.

Figure 13:
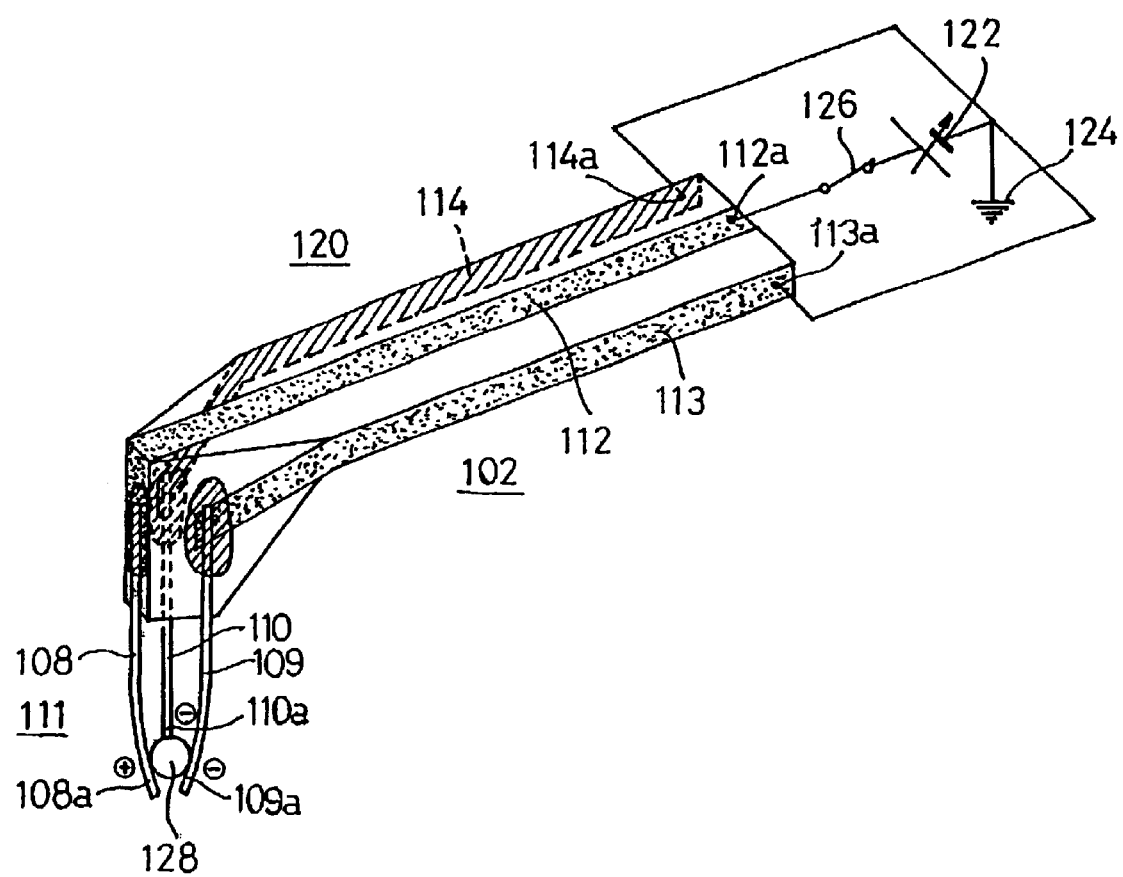
FIG. 13 is an explanatory diagram of the operation of the fourth embodiment gripping a spherical nano-substance.

FIG. 13 is an explanatory diagram of the above-described embodiment showing the state of gripping of a spherical nano-substance. First, the length of the nanotube 108 is set so that this length is slightly longer than those of the other nanotubes 109 and 110, thus disposing the nanotubes so that the tip end portion 108a protrudes further downward than the other tip end portions 109a and 110a. The location and position of a spherical nano-substance 128 on the surface of the sample are detected and confirmed by AFM scanning using the tip end portion 108a of this nanotube 108 as a probe needle.

Next, the nanotube gripping portion 111 is lowered and caused to contact the sample surface so that the spherical nano-substance 128 is enveloped in the center of the three tip end portions 108a, 109a and 110a. When the switch 126 is switched on in this state, a voltage is applied to the tip end portions 108a, 109a and 110a of the conductive nanotubes 108, 109 and 110 via the electrode films 112, 113 and 114. In other words, the tip end portion 108a becomes a positive pole, while the tip end portions 109a and 110a become negative poles. Since a positive charge accumulates in the positive pole and a negative charge accumulates in the negative poles, these electrodes are caused to flex inward by an electrostatic attractive force. Thus, the nanotube gripping portion 111 closes and grips the spherical nano-substance 128. When the switch 126 is turned off, the electrostatic attractive force disappears. As a result, the nanotube gripping portion 111 is caused to open by the elastic recovery force of the nanotubes, thus releasing the spherical nano-substance 128.

Figure 14:
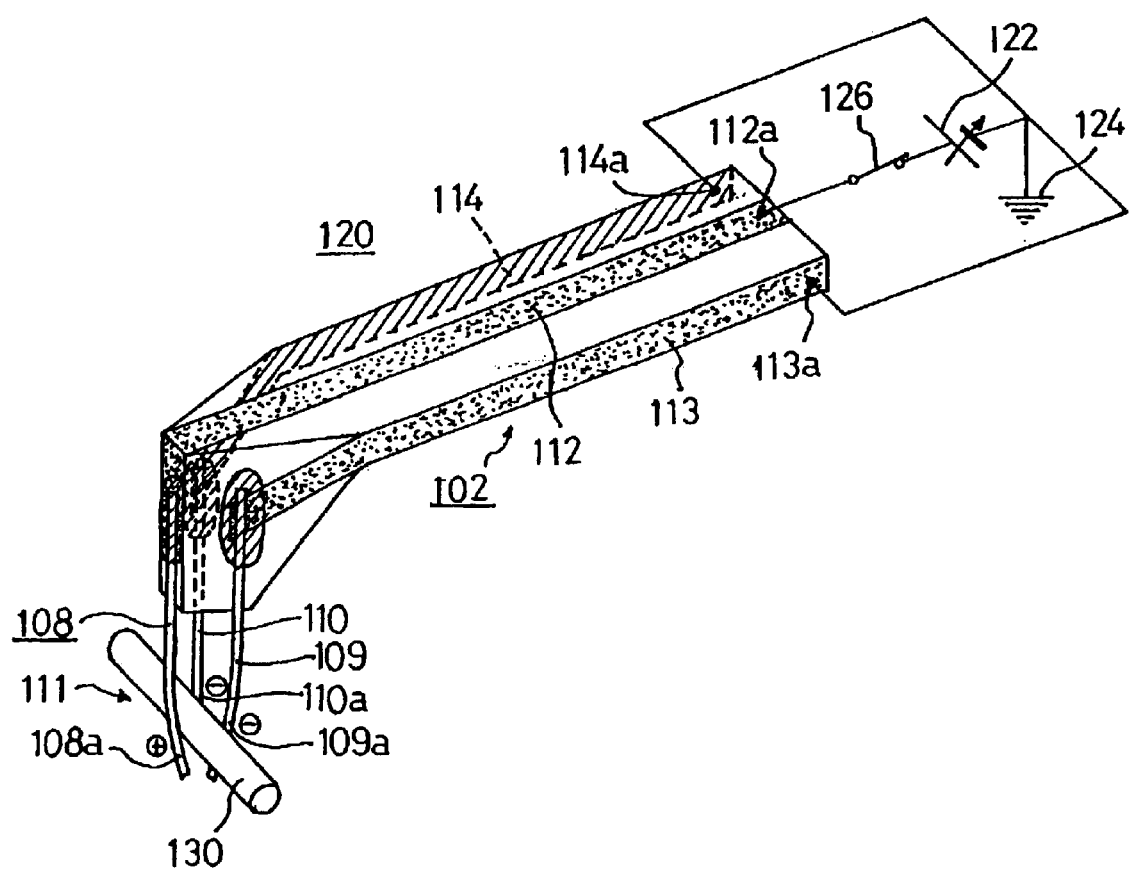
FIG. 14 is an explanatory diagram of the operation of the fourth embodiment gripping a rod-form nano-substance.

FIG. 14 is an explanatory diagram of the operation of the above embodiment showing the state of gripping of a rod-form nano-substance. First, the location and position of the rod-form nano-substance 130 on the surface of the sample are detected and confirmed by AFM operation using the tip end portion 108a of this nanotube 108 as a probe needle.

Next, the nanotube gripping portion 111 is lowered and caused to contact the sample surface so that the rod-form nano-substance 130 is surrounded by the three tip end portions 108a, 109a and 110a. When the switch 126 is switched on in this state, the tip end portions 108a, 109a and 110a are closed by an electrostatic attractive force. As a result, the rod-form nano-substance 130 is gripped from the front and back. If the nanotube gripping portion 111 is raised in this state, the rod-form nano-substance 130 is securely suspended as seen from FIG. 14.

In this embodiment, the nanotube gripping portion 111 of the electrostatic nanotweezers 120 comprises three conductive nanotubes 108, 109 and 110. Depending on the shape of the nano-substance, it is also possible to assemble the nanotube gripping portion 111 with four nanotubes. Thus, the above embodiment provides electrostatic nanotweezers which are characterized in that nano-substance are gripped and released by the opening and closing of three or more nanotubes.

Figure 15:
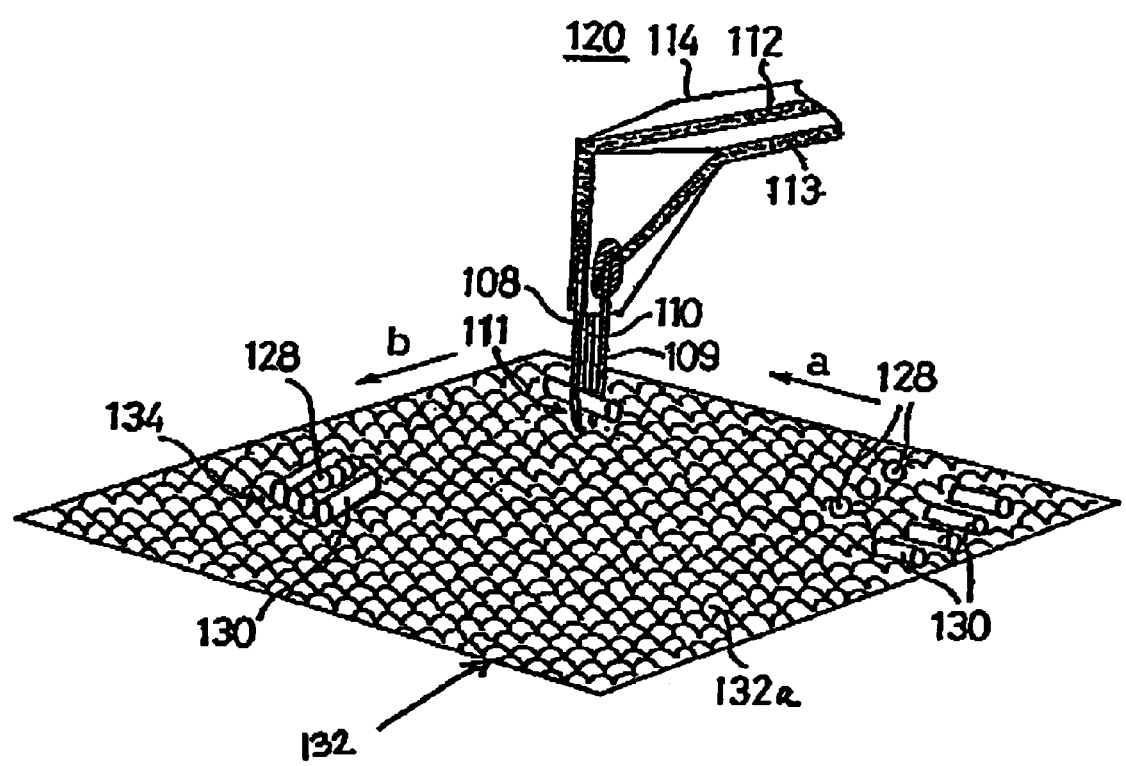
FIG. 15 is an explanatory diagram of the operation of a nanomanipulator device using the electrostatic nanotweezers of the fourth embodiment.
Figure 16:
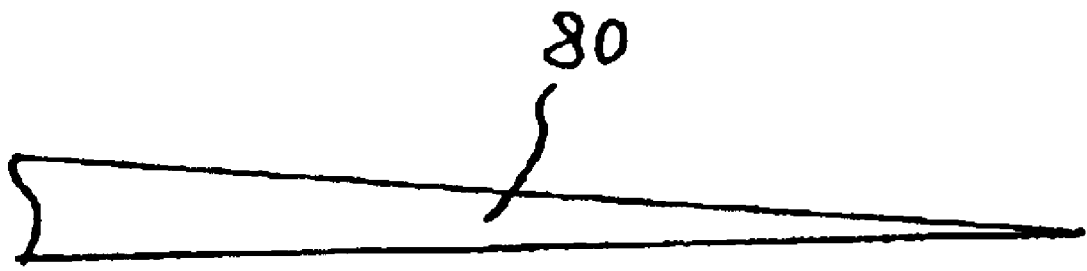
FIG. 16 is a side view of a conventional tapered glass tube.
Figure 17:
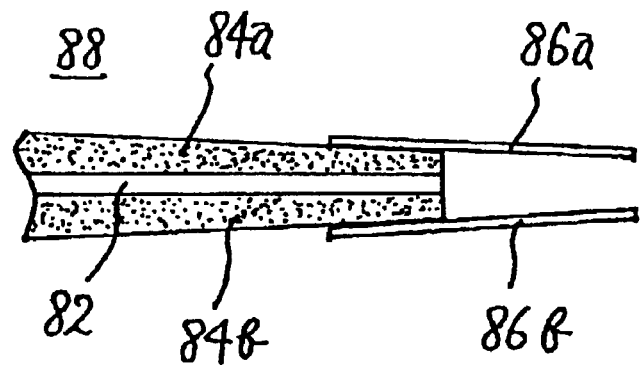
FIG. 17 is a schematic explanatory diagram of conventional nanotweezers.
Figure 18:
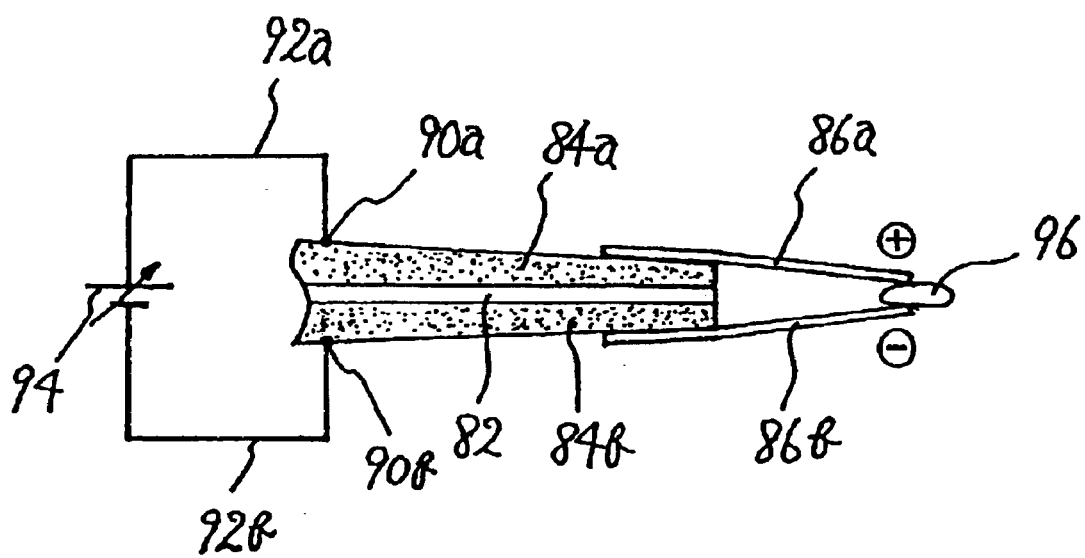
FIG. 18 is a schematic explanatory diagram showing the application of a voltage to conventional nanotweezers.

FIG. 15 is an explanatory diagram of the operation of a nanomanipulator device that uses the electrostatic nanotweezers. Numerous spherical nano-substances 128 and rod-form nano-substances 130 which constitute the materials to be handled are present on the surface of a sample 132. First, these raw-material nano-substances are detected by an AFM operation of the electrostatic nanotweezers 120, and each nano-substance is gripped by the nanotube gripping portion 111. Next, the electrostatic nanotweezers 120 are moved in the direction indicated by arrow a and the direction indicated by arrow b using a three-dimensional driving device (not shown), and the raw-material nano-substances are released in desired positions of a nano-structure 134. As a result of the repetition of these operations, a desired nano-structure 134 is formed on the surface of the sample 132 using various nano-substances as raw materials.

As described above, the closing operation of the conductive nanotubes 108, 109 and 110 is accomplished by means of an electrostatic attractive force created by the application of a voltage via the electrode films 112, 113 and 114. Also, the opening operation is accomplished by means of the elastic recovery force of the conductive nanotubes that operates when the voltage is eliminated. Control of the movement of the electrostatic nanotweezers 120 is realized by means of an AFM (atomic force microscope) movement control mechanism.

The AFM movement control mechanism shown in FIG. 5 is used to control the movement of these electrostatic nanotweezers from the raw material position to the nano-structure position. A nanomanipulator device is thus comprised by combining this movement control mechanism and the electrostatic nanotweezers 120. Since this is described in detail with reference to FIG. 5, a description thereof is omitted here.

The positions of the raw materials are confirmed by acquiring an image of the recesses and projections of the sample surface by way of using one of the three conductive nanotubes as an AFM probe needle. After a raw material has been picked up, the nanotube gripping portion 111 is moved to the position of the nano-structure, and the nanotube gripping portion 111 is opened, thus releasing the gripped nano-substance onto the sample surface 132a. The nano-structure is assembled by repeating this operation.

The overall shape of the nano-structure can be shown on a display device by performing an overall AFM operation using one nanotube of the nanotube gripping portion 111 or by performing such an operation in a state in which the three nanotubes are closed. Accordingly, the nanomanipulator device of the present embodiment is a nano-robot that allows free construction of a nano-world. This nanomanipulator device can be used in various types of atmospheres including vacuums and the natural atmosphere.

In the above-described embodiments, a required number of electrode films are formed on the cantilever as lead electrodes for the application of a voltage to the conductive nanotubes. As other methods, it is also possible to combine electrode films and lead wires, or to construct lead electrodes by means of lead wires alone. In extremely small areas, conductive nanotubes such as long carbon nanotubes can be used as lead wires. A fusion system or coating film system, etc. can be employed for joining the nanotubes to each other. The fusion system can be realized by methods, such as electron beam irradiation, ion beam irradiation or electrical current heating, etc.

The shown embodiments provide electrostatic nanotweezers that can grip nano-substances by means of an electrostatic force generated between conductive nanotubes. Accordingly, these electrostatic nanotweezers are effective in cases where the nano-substance that is to be gripped is an insulating substance. However, in the case of conductive nano-substances, there is a danger of short-circuiting. On the other hand, in cases where the surfaces of such conductive nanotubes are covered by an insulating coating film, there is no short-circuiting between the conductive nanotubes even when conductive nano-substances are gripped. Consequently, the nanotweezers can function effectively in such cases. Hydrocarbon films are suitably used as insulating films, and such coating films can be formed on the surfaces of the conductive nanotubes by electron beam irradiation. Naturally, other known materials and known methods are used as the materials and coating methods of such insulating films.

The present invention is not limited to the above-described embodiments. It goes without saying that various modifications and design alterations, etc. that involve no departure from the technical spirit of the present invention are included in the technical scope of the present invention.

INDUSTRIAL APPLICABILITY

In the first construction of the present invention the surfaces of the nanotubes are coated with an insulating substance, so that there is no short-circuiting even if the nanotweezers are closed by means of an electrostatic attractive force. Accordingly, nano-substances with all types of electrical properties can be manipulated using nanotweezers. The present invention can be applied to the overall structure of electrostatic attraction type nanotweezers.

In the second construction of the present invention, the pyramid portion of an AFM cantilever is used as a nanotube holder. As a result, the overall strength of the nanotweezers is high. Furthermore, since the wiring is constructed from nanotube lead wires or CVD lead wires, etc., ultra-fine nano-scale wiring is possible, and the circuit construction can be compact.

In the third construction of the present invention, the tip ends of the nanotubes are freely opened and closed by means of a piezo-electric film. Accordingly, nano-substances can be gripped regardless of differences in electrical properties, i.e., differences in terms of insulators, semiconductors or conductors. Also, the performance increase is possible compared to that of an electrostatic attraction system since there is no need for insulating coating films on the nanotubes.

In the fourth construction of the present invention, the pyramid portion of a cantilever is used as the holder in the third construction. Accordingly, the overall strength of the nanotweezers is high, and all types of object nano-substances are gripped regardless of the electrical properties of the nano-substances, so that nanotweezers with a broad range of applicability we provided.

In the fifth construction of the present invention, piezo-electric films are formed on pyramid pieces which are large in terms of size, instead of forming piezo-electric films on the nanotubes. Accordingly the formation of piezo-electric films is easier. As a result, since the size of the piezo-electric films is also increased, the working characteristics of the connection of nanotube lead wires to the piezo-electric films, etc. is also improved.

In the sixth construction of the present invention, three or more conductive nanotubes are used as members that grip nano-substances. Accordingly not only nano-substance with a flattened shape, but also nano-substances of other arbitrary shapes such as spherical nano-substances and rod-form nano-substances, etc. are stably and securely gripped. Furthermore, the opening and closing action of the conductive nanotubes is accomplished by means of an electrostatic attractive force generated by the application of a voltage and the elastic recovery force of the nanotubes that operates when the voltage is eliminated. Thus, the opening and closing operation is simple, and nano-substances can be easily gripped, moved and released.

In the seventh construction of the present invention, a semiconductor cantilever used for AFM measurements is utilized. Accordingly, durable high-strength electrostatic nanotweezers is provided.

In the eighth construction of the present invention, a three-dimensional driving mechanism that controls the movement of the nanotweezers in the X, Y and Z directions with respect to the sample is provided. Accordingly, a nanomanipulator device is realized in which nano-substances are gripped by nanotweezers or electrostatic nanotweezers and moved to desired positions, thus assembling nano-structures of arbitrary shapes.

In the ninth construction of the present invention, one nanotube selected from the three or more nanotubes that form the electrostatic nanotweezers is used as the probe needle of a scanning probe microscope. Accordingly, a nanomanipulator device that detects information concerning the physical properties of sample surfaces is provided. Furthermore, such a nanomanipulator device has a superior performance in which the positions of nano-substances are found on the surface of the sample and the nano-substances are gripped, moved and then released while confirming the shapes of the nano-substances.

What is claimed is:

1. Nanotweezers characterized in that said nanotweezers comprise: a plurality of deformable pyramid pieces that form a pyramid portion of a cantilever, nanotubes which are fastened so tip ends of said pyramid pieces, and a piezo-electric film which is formed on side surface of at lint one of said pyramid pieces; wherein tip ends of said nanotubes are opened and closed by applying a voltage to said piezo-electric film so that said piezo-electric film is caused to expand and contract, thus making said pyramid pieces flexible.

2. A nanomanipulator device characterized in that said nanomanipulator device is comprised of nanotweezers according to claim 1, and a three-dimensional driving mechanism that moves and controls said nanotweezers in X, Y and Z directions with respect to a sampler wherein nano-substances are transferred to said sample by said nanotweezers.

3. The nanomanipulator device according to claim 2, wherein at least one of said nanotubes that form said nanotweerzers is used as a probe needle of a scanning probe microscope.

* * * * *